United States Patent
Feng et al.

(10) Patent No.: US 9,404,645 B1
(45) Date of Patent: Aug. 2, 2016

(54) WIRING AND CONNECTION MANAGEMENT SYSTEM FOR INSTALLATION OF LED LIGHT ENGINES

(71) Applicant: Elemental LED, Inc., Emeryville, CA (US)

(72) Inventors: Robert Feng, San Francisco, CA (US); Russell Petersen, Alameda, CA (US)

(73) Assignee: Elemental LED, Inc., Emeryville, CA (US)

( * ) Notice: Subject to any disclaimer, the term of this patent is extended or adjusted under 35 U.S.C. 154(b) by 0 days.

(21) Appl. No.: 14/856,458

(22) Filed: Sep. 16, 2015

(51) Int. Cl.
| | |
|---|---|
| *H01R 4/60* | (2006.01) |
| *F21V 23/00* | (2015.01) |
| *F21V 23/06* | (2006.01) |
| *F21V 23/02* | (2006.01) |
| *H02B 1/015* | (2006.01) |
| *H02B 1/20* | (2006.01) |
| *F21Y 101/02* | (2006.01) |
| *H01R 25/14* | (2006.01) |
| *F21V 21/34* | (2006.01) |
| *A47F 5/10* | (2006.01) |

(52) U.S. Cl.
CPC ............ *F21V 23/001* (2013.01); *F21V 23/02* (2013.01); *F21V 23/06* (2013.01); *H02B 1/015* (2013.01); *H02B 1/20* (2013.01); *A47F 5/103* (2013.01); *F21V 21/34* (2013.01); *F21Y 2101/02* (2013.01); *H01R 25/14* (2013.01)

(58) Field of Classification Search
USPC .......................................... 439/117, 214, 215
See application file for complete search history.

(56) References Cited

U.S. PATENT DOCUMENTS

| | | | | |
|---|---|---|---|---|
| 4,973,796 | A | | 11/1990 | Dougherty et al. |
| 5,348,485 | A | * | 9/1994 | Briechle ................. H01R 25/14 439/110 |
| 5,593,049 | A | * | 1/1997 | Farham ................... H02G 3/288 174/499 |
| 6,527,406 | B1 | * | 3/2003 | Slesinger ................ A47F 11/10 312/223.6 |
| 6,780,034 | B2 | | 8/2004 | Shiroshita et al. |
| 6,897,381 | B2 | | 5/2005 | He et al. |
| 7,160,124 | B2 | | 1/2007 | Bhutani |
| 7,549,784 | B1 | | 6/2009 | Teeters |
| 8,545,045 | B2 | | 10/2013 | Tress |
| 8,864,347 | B2 | | 10/2014 | Pearson et al. |
| 8,939,779 | B1 | | 1/2015 | Lindblom et al. |
| 8,979,296 | B2 | * | 3/2015 | Wiemer ................... A47F 5/103 362/125 |
| 9,057,513 | B2 | * | 6/2015 | Lindblom ............... H01R 25/14 |

(Continued)

OTHER PUBLICATIONS

Hera Lighting,"Electrified Shelf Systems: Power Standard." Internet. Available at http://www.heralighting.com/top/products/led/electrified-shelf-systems/power-standard/download-product-sheet/. No date.

(Continued)

*Primary Examiner* — Tho D Ta

(74) *Attorney, Agent, or Firm* — PatentBest; Andrew McAleavey

(57) ABSTRACT

A wiring and connection management system is disclosed. The system comprises a set of power distribution members that are attached to a substrate and are connected together, forming a power grid to distribute power across the substrate. The members include a number of connectors disposed at regular intervals along their lengths. Corresponding sets of cables and connectors on the substrate convey power from the members to areas on the substrate where power is desired. The substrate may be, for example, a shelving unit. The system provides a robust, flexible source of power that is easily installed with minimal training and is also easily maintained.

26 Claims, 6 Drawing Sheets

(56) References Cited

U.S. PATENT DOCUMENTS

| | | | |
|---|---|---|---|
| 9,098,823 B2 | 8/2015 | Slesinger et al. | |
| 9,115,858 B2 | 8/2015 | Levante et al. | |
| 9,130,327 B2* | 9/2015 | Flynn | H01R 25/14 |
| 2006/0209537 A1 | 9/2006 | Stelmasik et al. | |
| 2008/0092782 A1* | 4/2008 | Daniel | A47F 5/103 |
| | | | 108/50.02 |
| 2014/0036505 A1 | 2/2014 | Barton | |
| 2014/0224875 A1* | 8/2014 | Slesinger | H01R 25/142 |
| | | | 235/385 |
| 2014/0292211 A1 | 10/2014 | Huang | |
| 2014/0362574 A1 | 12/2014 | Barrett | |
| 2015/0070882 A1 | 3/2015 | Ohno | |

OTHER PUBLICATIONS

Lozier, Quick Connect Lights, Feb. 24, 2016, 1-6, Omaha, NE.

* cited by examiner

WIRING AND CONNECTION MANAGEMENT SYSTEM FOR INSTALLATION OF LED LIGHT ENGINES

BACKGROUND OF THE INVENTION

1. Field of the Invention

The invention relates to wiring and connection management systems for installation of light-emitting diodes (LEDs).

2. Description of Related Art

In the last 15 years, light-emitting diodes (LEDs) have gone from an extravagant curiosity in the lighting industry to a viable and vital lighting source in any number of applications. LEDs require relatively little power, operate at low temperatures, have long life spans, are mechanically robust, and have a small footprint, especially when compared with traditional incandescent, and even fluorescent, light bulbs. All of those attributes make LEDs very advantageous to use in a variety of applications in which traditional lighting technologies would require too much space or generate too much heat, or when accessing and replacing traditional light bulbs would be too laborious or difficult. Additionally, the plethora of LED products on the market offer a variety of light levels (i.e., output lumens), colors, form factors, power supplies, and controls.

As a practical matter, the advantages of LEDs and the range of products that are available mean that an LED solution can be configured for virtually any lighting application. However, configuring LEDs to function in different applications often presents engineering challenges of its own.

One major engineering challenge in configuring LEDs for particular applications is the wiring and cabling necessary to supply the LEDs with power. A typical lighting application may require several different strips or sets of LEDs, each of which needs to be connected to a power supply. In situations where there are several strips or sets of LEDs (e.g., when each shelf of a shelving unit is to be individually lit), the resulting plethora of cords and cables can become an unwieldy tangle, and necessary solder joints can break, if the installers do not take special care to arrange and organize them when the LEDs are installed. However, even a careful, correct LED installation can leave numerous cables dangling—and with all of those cables, it can be difficult to determine whether or not the installation is correct, and equally difficult to prevent accidental damage or disconnection in the field.

SUMMARY OF THE INVENTION

Aspects and embodiments of the invention relate to a wiring and connection management system. According to one aspect of the invention, an elongate first power distribution member is attached to a power supply and is typically mounted vertically on a substrate along a hidden portion of the substrate. Elongate second power distribution members are attached to the substrate and are connected to the first power distribution member. The power distribution members carry conductors to conduct power along their lengths. Connectors are positioned, typically at regular intervals, along at least the second power distribution members. Another set of connectors is positioned on the substrate to convey power from the hidden portion of the substrate to a portion of the substrate where power is required. Cables are connected between the connectors on the horizontal members and the connectors on the substrate, and typically extend straight from the members for short lengths. The power distribution members, with their cables and connectors, thus form a power distribution grid that places a number of power connectors in easy reach of LED light engines or other elements requiring power. The grid may run essentially the entire width and height of the substrate, or at least the width and height of the portion over which power is desired. In some cases, the grid may span multiple, adjacent substrates.

In one embodiment, the power distribution members may be printed circuit boards (PCBs), and the connectors may be surface-mount connectors. The members, whether PCBs or made of some other material, would typically be substantially rigid. As a whole, the system provides a great deal of flexibility in where and how LED light engines and other elements requiring power can be installed. The connectors make it easier to install LED light engines with little training, and rigid power distribution members, like PCBs, make the system itself more robust and easier to install.

In some embodiments, the power distribution members may be in the same plane, e.g., installed on the same surface of a substrate. However, in other embodiments, the power distribution members may be installed in different planes, or on different surfaces, of a structure. In other embodiments, it may not be necessary to include two types of power distribution members. Instead, LED light engines may draw power from a single power distribution member mounted, e.g., horizontally or vertically.

Another aspect of the invention relates to shelving units with systems according to embodiments of the invention installed so as to provide power to LED light engines installed on the units to light shelves. The shelving units may, for example, be gondola shelving units.

Other aspects, features, and advantages of the invention will be set forth in the description that follows.

BRIEF DESCRIPTION OF THE DRAWING FIGURES

The invention will be described with respect to the following drawing figures, in which like numerals represent like features, and in which.

DETAILED DESCRIPTION

Figure 1:
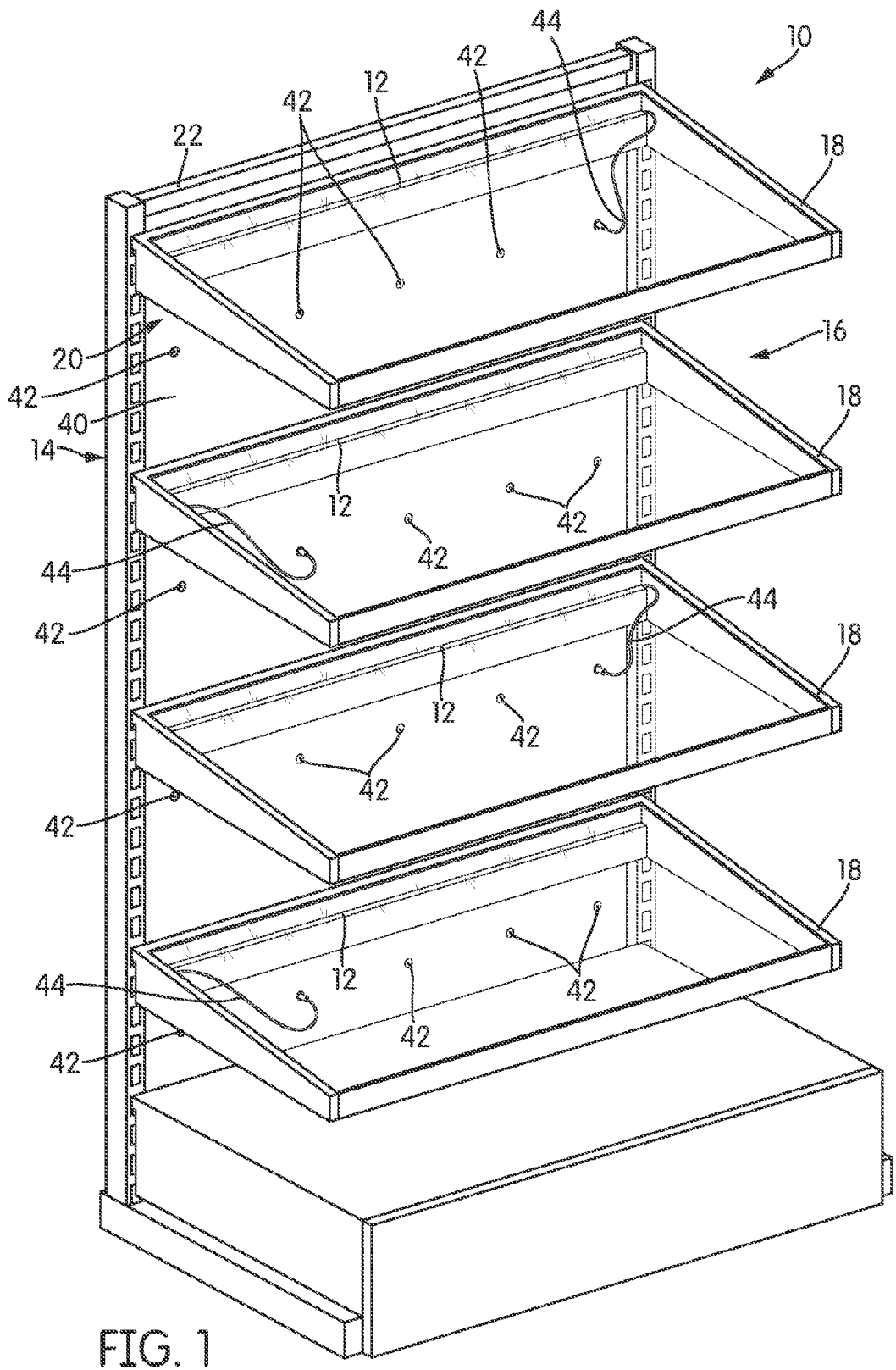
FIG. 1 is a perspective view of a shelving unit with LEDs installed to illuminate each shelf individually, illustrating a wiring and cable management system according to an embodiment of the invention.

FIG. 1 is a perspective view of a wiring and cable management system, generally indicated at 10, which supplies power to a number of LED light engines 12. The LED light engines 12 of this embodiment are rigid PCBs with LEDs installed, and are arranged to illuminate individual shelves of a shelving unit 14. In the illustrated embodiment, the shelving unit 14 is a gondola shelving unit with a plurality of shelves 18.

The wiring and cable management system 10 has broad use in a variety of applications. While FIG. 1 illustrates its use in a gondola shelving unit 14, the wiring and cable management system 10 is particularly advantageous in any type of installation where the wiring for the LED light engines 12 is to be hidden. The substrate on which the system 10 is installed may be a shelving unit of another type; a piece of furniture, such as a desk, cabinet or armoire; a door; or a wall or wall panel, to name but a few options. Typically, the substrate (in this case, the shelving unit 14) will have a visible area that is to be illuminated and a more hidden area. In the illustration of FIG. 1, the visible area 16 comprises the front of the shelving unit 14, where the LED light engines 12 are installed proximate to each shelf 18, and the reverse side 22 of the rear wall 20 of the shelving unit 14 acts as the hidden area. Of course, the hidden area and the visible area may be on the same side of the substrate in some cases. In other cases, there may not be separate hidden and visible areas; the power may simply need to be distributed from a first portion of the substrate to a second portion of the substrate.

Figure 2:
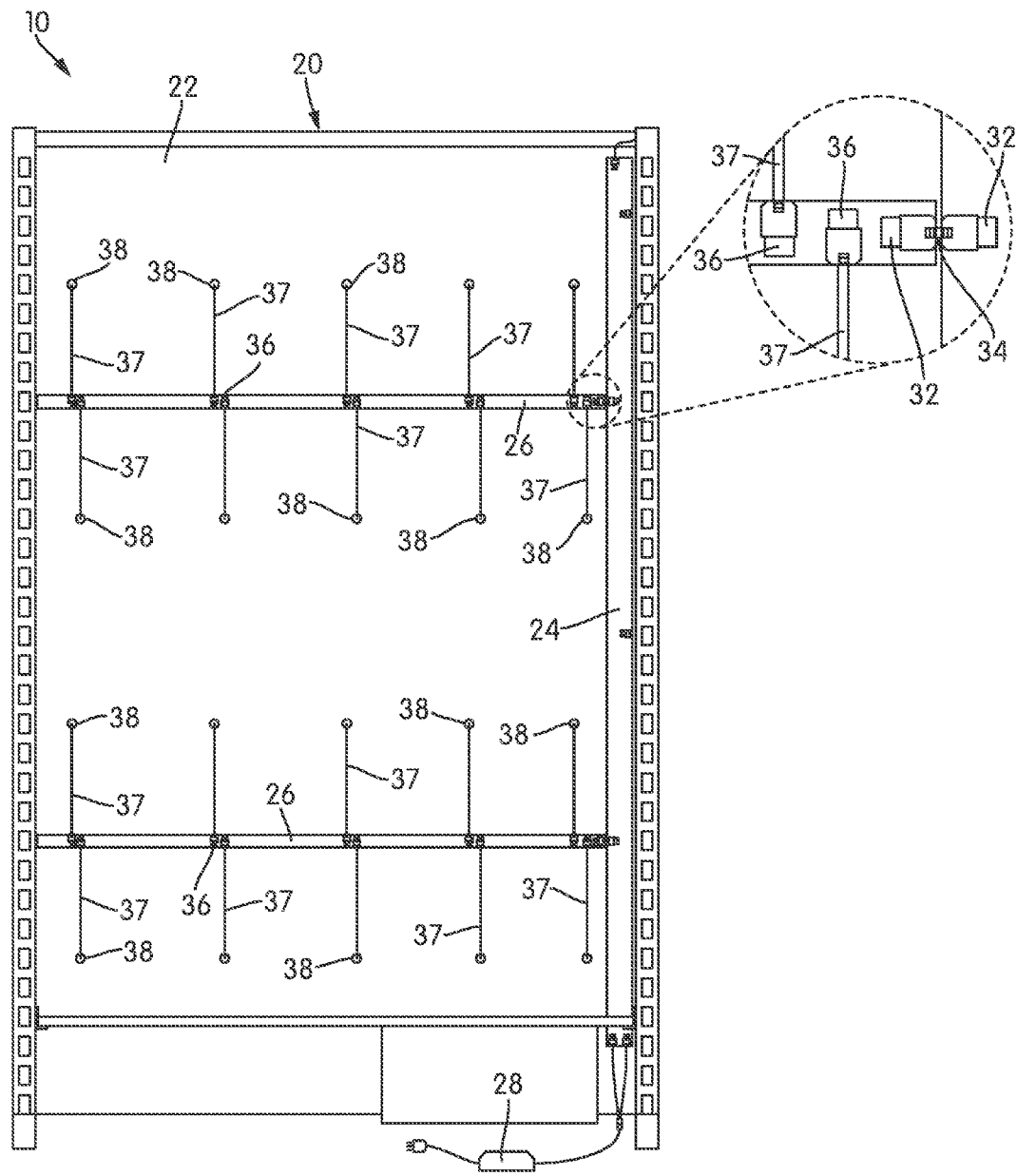
FIG. 2 is a rear elevational view of the shelving unit of FIG. 1.

FIG. 2 is a rear elevational view of the shelving unit 14. On the reverse side 22 of the rear wall 20, the system 10 comprises one or more first power distribution members 24 and one or more second power distribution members 26. In the illustrated embodiment, the first power distribution members 24 extend vertically, and the second power distribution members 26 extend transversely or horizontally, with the overall arrangement forming a power distribution grid. However, the members 24, 26 need not be strictly vertical and horizontal.

The members 24, 26 are individually secured to the substrate on which they are mounted, in this case, the reverse side 22 of the rear wall 20. The members 24, 26 may be attached using adhesives, magnets (if the substrate is metal), or mechanical fasteners, such as bolts, screws, and nails. The advantage of means such as magnetic tape and adhesives is that the members 24, 26 can be moved around and positioned as needed, allowing for unforeseen but necessary adjustments in position while in the field.

In the illustration of FIG. 2, there is a single, vertical first power distribution member 24 and there are two transverse second power distribution members 26, although as will be described below in more detail, there may be more or fewer members 24, 26 in other embodiments.

Depending on the arrangement, one or more of the members 24, 26 is connected to a power supply 28. In the illustrated embodiment, the single first power distribution member 24 is connected to the power supply 28, although in other embodiments, one of the second power distribution members 24 may be connected to a power supply 28. In some cases, several members 24, 26 may be connected to different power supplies 28 to provide either more power, redundant power supplies, or separate power for specific parts of the grid created by the members 24, 26.

The precise nature of the power supply 28 will vary with the type and requirements of the LED light engines 12 that it is to power. Typically, the power supply 28 will supply relatively low voltage direct current. For example, a 24V, 4 Amp DC power supply may be suitable in at least some embodiments. Thus, if the power available is 110V AC or 220V AC, the power supply 28 will include a transformer, an inverter, or other such conventional power conversion components. In some cases, the power supply may be a switched mode power supply. Of course, the precise construction of the power supply 28 is not critical to the invention. In some embodiments, the power supply 28 may be a hardwired driver installed within the unit or an external adapter.

The purpose of the grid 30 created by the members 24, 26 is to distribute power from the power supply 28 across the substrate on which the LED light engines 12 are to be mounted. In their most basic form, the members 24, 26 are elongate, preferably thin, and carry at least power conductors. If the LED light engines 12 are addressable or require more elaborate control circuitry, the members 24, 26 may carry additional conductors to act as signal lines as well. Member connectors 32, connected by short board-to-board cables 34, connect the first power distribution member 24 with the various second power distribution members 26, which are spaced from one another along the length of the first power distribution member 24. In the illustrated embodiment, the second power distribution members 26 extend across the width of the shelving unit 14. The first power distribution member 24 of FIG. 2 is positioned at the side of the rear wall 20, although it may be positioned in the center of the rear wall 20 or at any other position in other embodiments or installations.

Each second power distribution member 26 carries a number of connectors 36 that are intended to connect with and convey power to LED light engines 12 (i.e., circuit boards or strips including LEDs). Another short cable 37 extends between the connector 36 on the second power distribution member 26 and a jack, socket, channel, or other type of connector 38 that carries power to the front side 40 of the rear wall 20. As shown in FIG. 2, a single second power distribution member 26 can be arranged such that it serves cables 37 that extend both above and below it. The orientation of the connectors 36 would generally be such that a cable 37 can emerge and extend either directly up or directly down. Because a single second power distribution member 26 can make connections both above and below its position, in some embodiments, that may reduce the need for multiple second power distribution members 26. However, it is beneficial if the cables 37 are not very long and have lengths tailored for the particular installation; thus, the decision of how many second power distribution members 26 to use will typically balance a number of factors, including cable length and layout, the number of connections to be made, and the desired position of any connectors 38.

For ease of installation, in most embodiments, it is helpful to maintain the gridlike arrangement shown in FIG. 2. Cables 37 extend straight and at regular intervals, and the second power distribution members 26 provide connections both above and below their positions. The connectors 38 are provided at regular or irregular intervals, as are the corresponding connectors 36 on the second power distribution members 26. As one example, the cables 37 that extend between the second power distribution members 26 and the jacks 38 may be about 6 inches (15.2 cm) long. Board-to-board cables 34 may be either 4 inches (10.2 cm) or 6 inches (15.2 cm). In general, the cables 34, 37 will be on the order of at least about 1 inch (2.54 cm) long, but may be of indefinite length, although it is desirable to keep cables short.

While maintaining a grid layout is advantageous, the positioning of the connectors 38 is application dependent and is not critical. A particular advantage of system 10 is that it is adaptable enough in its arrangement that it can provide power anywhere on the substrate by using a connector 36 at an appropriate position on the second power distribution member 26, choosing a cable 37 of an appropriate length, and placing front-side connectors 38 appropriately. In particular, while the front-side connectors 38 of the illustrated embodiment are shown as being arranged at a particular, constant pitch, they may be arranged in any way and need not be at a constant pitch or even in a linear arrangement relative to one another. For example, the connectors 38 could be arranged in a circle or any other regular or irregular shape.

Additionally, some shelving units, like the gondola shelving unit 14, provide for movable shelves 18, or shelves whose vertical position can be selected. Shorter or longer cables 44 along the front side 40 of the rear wall 20 can be used to accommodate different shelf positions, although if the positions of the shelves 18 are radically different, it may be helpful to install additional second power distribution members 26 or to move the front-side connectors 38.

The actual construction of the power distribution members 24, 26 is also not critical, so long as the members 24, 26 can safely conduct power and perform the other functions ascribed to them in this description. In different embodiments, the members 24, 26 may be constructed in different ways and have different forms. For example, the members 24, 26 may be plastic strips with wire conductors arranged in channels within the strips. A member similar to a conventional track lighting track may also be used. For ease in installation and maintenance, it may be helpful if the members 24, 26 are made to be rigid, or nearly so.

While any number of materials and constructions may be used for the members 24, 26, the present inventors have found that one advantageous way in which to construct the members 24, 26 is to use printed circuit boards (PCBs). PCBs are relatively cheap, are easily fabricated with known, predictable processes, and are designed to have connectors and other types of surface-mount devices attached. If the members 24, 26 are PCBs, as they are in the illustrated embodiment, the connectors 32, 36 would typically be surface-mount connectors or through hole connectors that are soldered to the respective members 24, 26 at appropriate intervals on appropriate contact pads.

Figure 3:
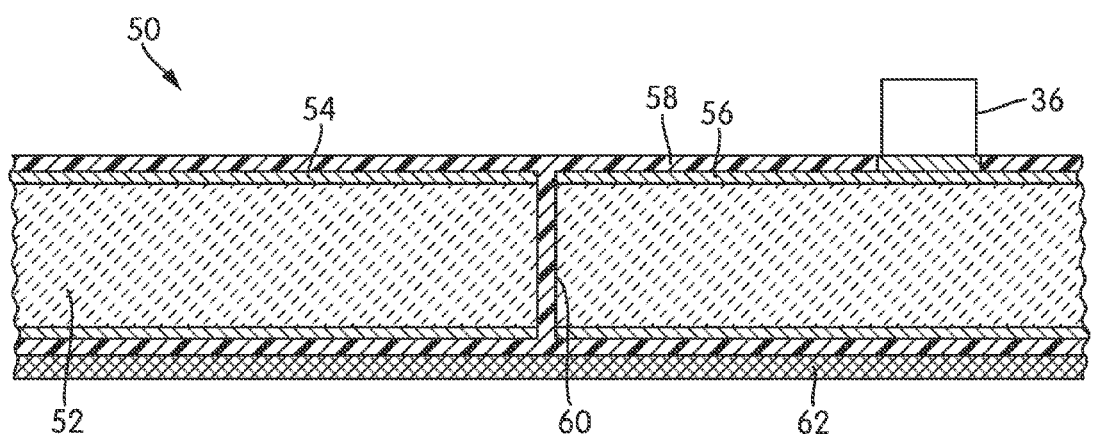
FIG. 3 is a cross sectional view of one of the power distribution members of FIG. 2.

FIG. 3 is a schematic cross section of a PCB, generally indicated at 50, that would be suitable for use as either a first power distribution member 24 or a second power distribution member 26. The board 50 has a core 52 that is typically a conventional PCB composite material, such as an FR4 glass-reinforced epoxy laminate. Metallization layers 54, 56, typically of copper or aluminum, are covered with a conventional insulating/passivating layer 58. Vias 60, and other conventional structures, may be defined in or through the PCB 50 to allow it to convey power. The PCB 50 may be, for example, 1.6 mm thick with about 0.5 oz (14.2 g) of copper for the metallization layers 54, 56. FIG. 3 also illustrates a magnetic layer 62 adhered to the underside of the PCB 50 (the layer of adhesive itself is not shown). As was described above, the magnetic layer 62 may instead be a layer of adhesive.

As one example, in its finished form, a first power distribution member 24 may be 46 inches (116.8 cm) long and 1.35 inches (3.4 cm) wide. A second power distribution member 26 may be, for example, 32.15 inches (81.7 cm) long and 0.69 inches (1.75 cm) wide. Of course, these will vary with the size of the shelving unit 14 or other substrate, and making longer PCBs may pose a manufacturing challenge. For those reasons, as will be described below in more detail, the members 24, 26 may be broken into modular sections.

In embodiments of the invention, it is helpful if the members 24, 26 are rigid or nearly so. Rigidity may allow installers to install the members 24, 26 on a substrate with more ease, and can also make it easier to attach cables 34, 37 to connectors 36. Rigid members 24, 26 also make it less likely that solder joints will be compromised during handling, transport, and installation. Failed solder joints could cause connectors 36 to pop off of the members 24, 26 or, perhaps more insidiously, to remain attached to the members 24, 26 but stop functioning. As those of skill in the art will appreciate, conventional PCBs, like FR4 PCB 50, have some degree of innate rigidity. The metallization layers 56 that allow the board to conduct current will add to that rigidity, and if the metallization layers 56 are specified to be very thick relative to the thickness of the PCB 50, the resulting PCB 50 will be quite rigid. However, metal is expensive, and embodiments of system 10 will typically seek a balance between rigidity and cost. The present inventors have found that while absolute rigidity might be helpful, it is acceptable if a member 24, 26 deflects slightly under its own weight when held up against gravity. In the industry, this type of LED PCB is referred to as "semi-rigid."

The mechanical strength and properties of other elements of system 10 can also contribute to its overall durability and ease of use. For example, it would be possible to connect the connectors 38 on the substrate to the connectors 36 on the second power distribution members 26 with any type of wires, ribbon cables, etc. However, it is helpful if the cables 37 have sufficient mechanical strength to support the second power distribution members 26 on their own. If this is the case, then the second power distribution members 26 will remain in position even if the adhesive, magnets, or other mechanism that attaches them to the substrate 22 fails.

On the front side 40 of the rear wall 20, as shown in FIG. 1, each of the connectors 38 on the reverse side 22 has a corresponding connector 42 on the front side 40. Power cables 44 connected to the LED light engines 12 can be connected to and disconnected from the connectors 42. In the illustration of FIG. 1, a single LED strip 12 is connected to one of the connectors 42 at the level of each shelf 18. Other connectors 42 are available at each level for the LED strip 12 or other LED light engines 12. The advantage of an arrangement like that in system 10 is that an installer can choose whichever connector 42 is most convenient for the particular LED strip 12, and the overall grid layout provides for an ample number of connectors 42. Overall, power may enter the grid at any point and loads (e.g., LED light engines 12) may be connected at any point.

The cables 44 and connectors 42 may be any connectors suitable for the voltage and current levels being used. For example, standard DC barrel connectors may be used in some embodiments. The nature of the connectors 42 is not critical, and may be application- or environment-specific. For example, connectors that lock cables 44 in place may be helpful in some embodiments and not in others. Barrel connectors may have too high of a profile for some applications, necessitating connectors with a lower profile.

While the precise nature of the connectors is not critical to system 10, overall, it is advantageous if the parts of system 10, including the various connectors 36, 38, 42, are robust and are easily connected and disconnected in the field with a minimum of training Common, familiar types of connectors, particularly those with which it is easy to discern if a good connection has been made, may be helpful in that.

Figure 4:
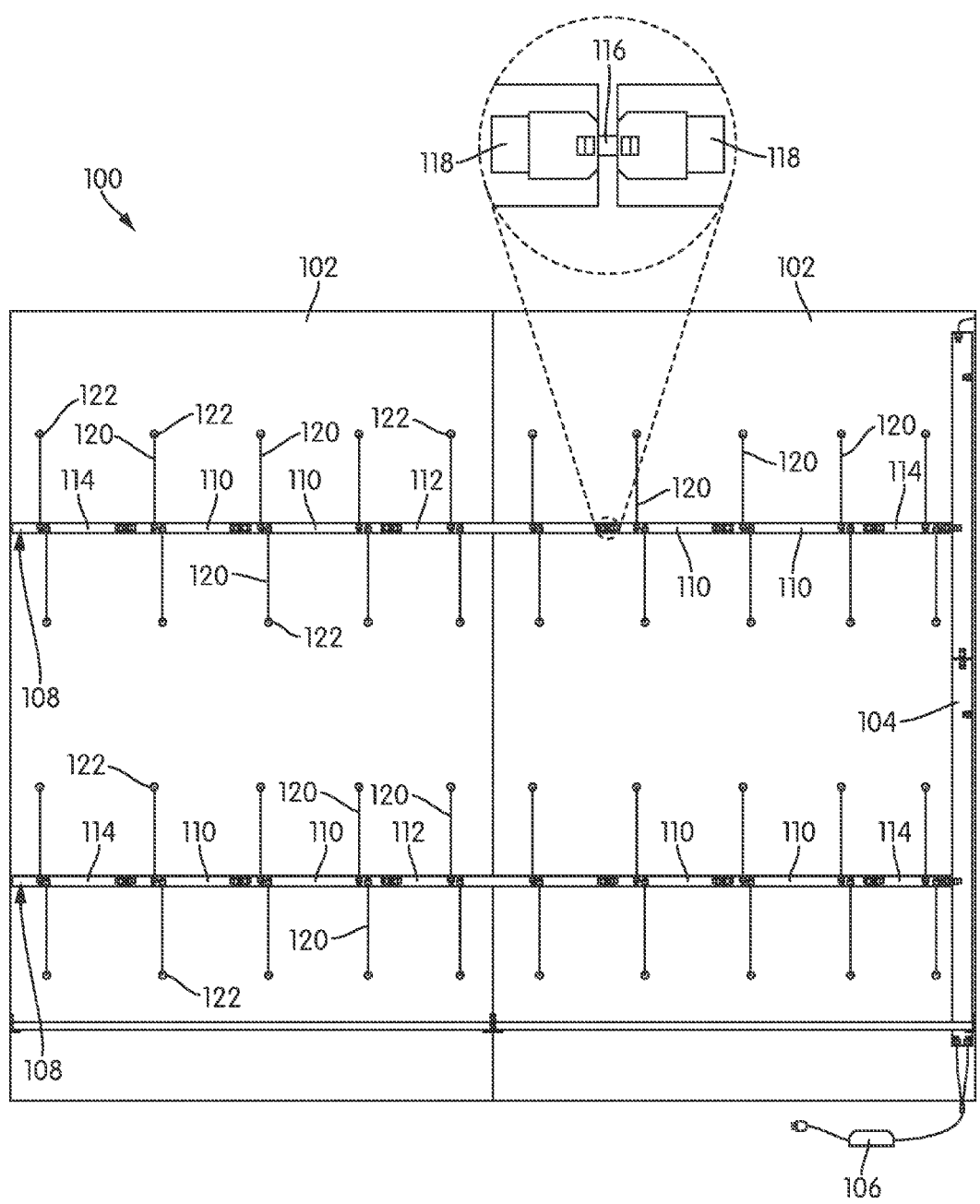
FIG. 4 is a rear elevational view of a system according to another embodiment of the invention with multiple, modular power-conveying members that span multiple substrates.

In system 10 of FIGS. 1-3, vertical and second power distribution members 24, 26 are sized for their particular substrate, a gondola shelving unit 14, so that they span its width and height. In other embodiments, vertical and second power distribution members may be made in modular, standardized sizes and connected board-to-board to span any size and, potentially, any number of adjacent substrates. As an example, FIG. 4 is an elevational view of a system 100, shown as installed on a pair of adjacent, generic substrates 102.

A first power distribution member 104 is connected to a power supply 106 and spans much of the height of the substrates 102. There are two lines 108 of second power distribution members spanning the width of the two adjacent substrates 102. Those two lines 108 are comprised, in the illustrated embodiment, of second power distribution members 110, 112, 114 of differing, modular lengths. The second power distribution members 110, 112, 114 are connected by short cables 116 that connect to board-to-board connectors 118. In FIG. 4, the first power distribution member 104 is also broken into modular segments. As was described briefly above, although the first power distribution member 104 is connected to a power supply 106 in FIG. 4, power and loads may be connected to any point on the grid.

As with system 10, system 100 provides a gridlike layout with cables 120 and connectors 122 at regular intervals. As with system 10, the cables 120 extend above and below the lines 108 of second power distribution members 110, 112, 114. Depending on the nature of the substrates 102 and the application, the cables 120 may be the same length as those in system 10 or they may be different lengths.

If the amount of power required for the strips of LEDs 12 is more than can be supplied by a single first power distribution member 104 connected to a single power supply 106, more first power distribution members 104 can be provided across the widths of the substrates 102.

Figure 5:
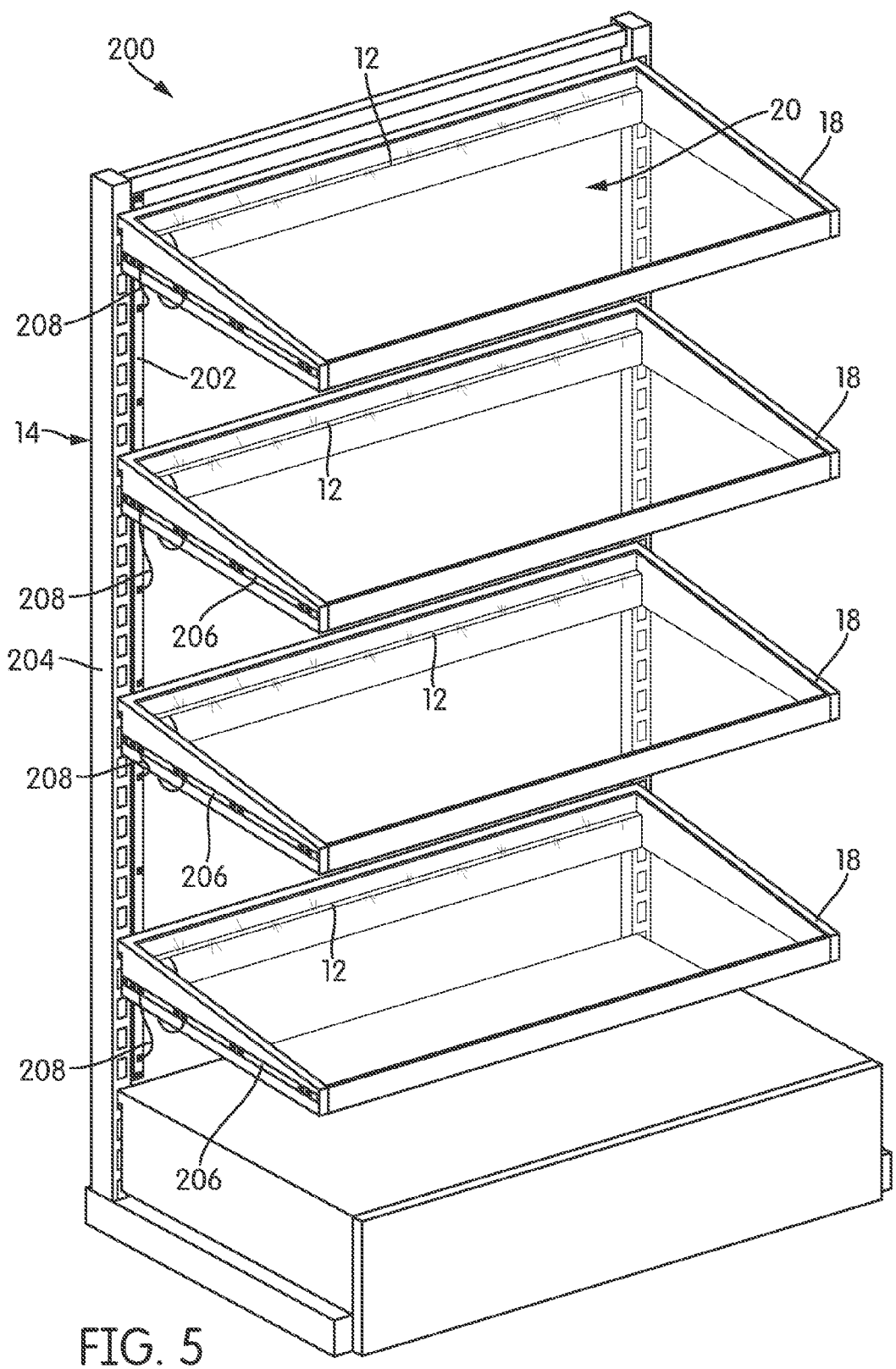
FIG. 5 is a perspective view of a system according to yet another embodiment of the invention, in which first and second power distribution members are positioned on different planes or surfaces of the substrate.

In the embodiments described above, the first and second power distribution members 24, 26, 104, 108 are installed in the same plane or along the same surface of the substrate. However, that need not be the case in all embodiments. FIG. 5 is a perspective view of a system 200, as installed on a shelving unit 14. In system 200, a first power distribution member 202 is positioned on one side of the shelving unit 14, adjacent to one of its upright supports 204, and extends vertically. Shorter second power distribution members 206 extend along the sides of each of the shelves 18, each one providing power for a light engine 12 positioned to illuminate each shelf 18.

Notably, the first power distribution member 202 is on one surface of the shelving unit 14 and the second power distribution member 206 is on another surface. In the illustrated embodiment, they are essentially orthogonal to one another, although that need not be the case in other embodiments. Cables 208 connect the first and second members 202, 206. The surfaces on which the members 202, 206 are mounted in FIG. 5 are only exemplary; in other embodiments, the members 202, 206 may be mounted on any surfaces and may have any orientation relative to one another, although as was noted above, a grid-like arrangement may be advantageous. The members 202, 206 may be secured to their respective surfaces in any way, including with magnets, magnetic tape, or adhesives.

Also notable about system 200 is the absence of intermediate cables and connectors 37, 38, 42 to connect from the second members 206 to another part of the substrate. An advantage of the arrangement shown in FIG. 5 is that system 200 eschews these types of connectors and simply places the second power distribution members 206 within reach of the LED light engines 12 themselves.

Figure 6:
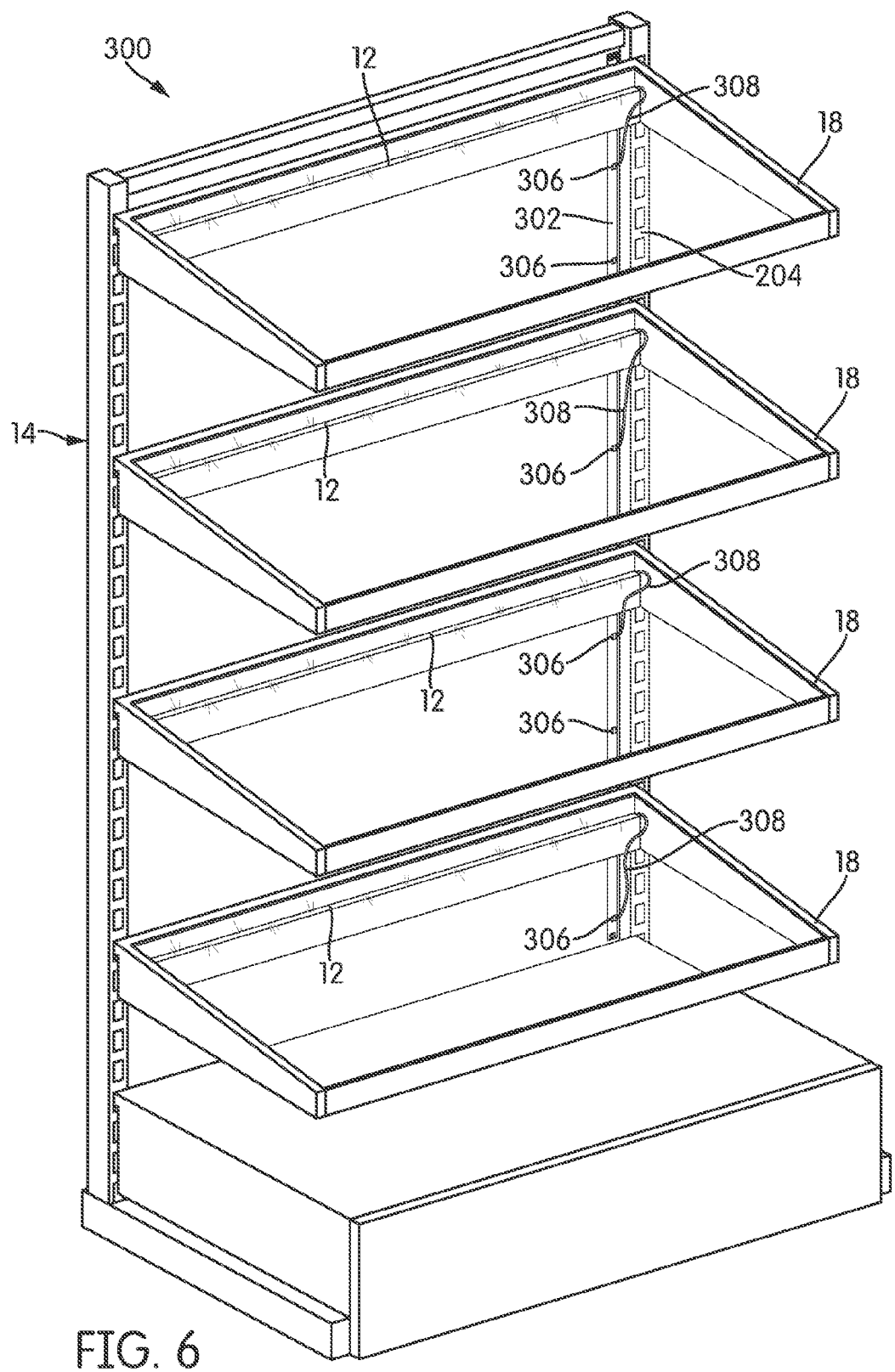
FIG. 6 is a perspective view of a system according to a further embodiment of the invention, in which LED light engines draw power directly from a single power distribution member.

In certain applications, there may be no need for both first and second power distribution members, and embodiments of the invention may be made without both types of members. For example, FIG. 6 is a perspective view similar to the view of FIG. 5, illustrating a system 300, shown as installed on a shelving unit 14 with a plurality of shelves 18. In system 300, a single power distribution member 302 extends vertically adjacent to an upright 204 of the shelving unit 14. The power distribution member 302 carries a number of connectors 306 spaced at intervals from one another. Cables 308 connect between connectors 308 on the power distribution member 302 and LED light engines 12.

In the two systems illustrated in FIGS. 5 and 6, the power distribution members 202, 206, 302 may be either unitary and sized for the particular shelf 14 or other structure on which they are installed, or they may comprise lines of shorter, modular PCBs or other elements that are strung together to span the length of a particular portion of the substrate, as in system 100 of FIG. 4. In general, the features of the various systems 10, 100, 200, 300 disclosed here may be used in combination.

Although certain portions of this description focus on LED light engines 12 as the elements on the substrate 102 requiring power, systems 10, 100, 200, 300 according to embodiments of the invention may be used to power any kind of element, particularly any kind of element that operates with relatively low voltage DC power.

In this description, and in the appended claims, words like "generally" and "about" should be construed to mean that the dimension, range, or other characteristic modified by these terms need not be exact in order for embodiments of the invention to function properly. Deviations from the described dimension, range, or other characteristic of 5% or 10%, for example, are possible, so long as they do not compromise function.

While the invention has been described with respect to certain embodiments, the description is intended to be exemplary, rather than limiting. Modifications and changes may be made within the scope of the invention, which is defined by the appended claims.

What is claimed is:

1. A wiring and connection management system, comprising:
   a power supply;
   a first elongate, at least semi-rigid printed circuit board (PCB) having first power and ground conductors connected to the power supply, the first PCB adapted to be attached to a first area of a structure so as to extend in a first direction along the structure;
   one or more second elongate, at least semi-rigid PCBs adapted to be attached to the first area of the structure proximate to the first PCB so as to extend in a second direction along the structure, the second direction being different than the first direction, the one or more second PCBs having second power and ground conductors that are adapted to be electrically connected to the first power and ground conductors of the first PCB;
   first sets of connectors mounted directly on the one or more second PCBs and connected to the second power and ground conductors; and
   second sets of connectors electrically connected to the first sets of connectors, the second sets of connectors being positioned, structured, and adapted to bridge between the first area of the structure and a second area of the structure so as to provide power connection points along the second area of the structure.

2. The wiring and connection management system of claim 1, further comprising at least one set of LED light engines adapted to be mounted on the second area of the structure and connected, at least indirectly, to the second sets of connectors to draw power.

3. The wiring and connection management system of claim 1, wherein the first sets of connectors are surface-mount connectors mounted on the one or more second PCBs.

4. The wiring and connection management system of claim 1, wherein within individual ones of the first sets of connectors, some of the connectors have different orientations than others of the connectors.

5. The wiring and connection management system of claim 1, wherein the first PCB and the one or more second PCBs are arranged in a grid relative to one another, with the first and second directions being at least substantially orthogonal to one another.

6. The wiring and connection management system of claim 1, wherein the first PCB comprises at least two semi-rigid PCBs electrically connected together.

7. The wiring and connection management system of claim 1, wherein at least some of the one or more second PCBs comprise at least two semi-rigid PCBs electrically connected together.

8. The wiring and connection management system of claim 1, wherein the first and second PCBs are attached to the substrate with magnets or adhesives.

9. The wiring and connection management system of claim 1, wherein the first area of the structure is hidden relative to the second area of the structure.

10. The wiring and connection management system of claim 9, wherein the structure comprises a gondola shelving unit.

11. The wiring and connection management system of claim 10, wherein the first area of the structure comprises a reverse side of a rear wall of the gondola shelving unit.

12. The wiring and connection management system of claim 11, wherein the second area of the structure comprises a front side of a rear wall of the gondola shelving unit.

13. The wiring and connection management system of claim 1, wherein the first PCB comprises a third set of connectors mounted directly on the first PCB, the third set of connectors being electrically connected to the first power and ground conductors.

14. The wiring and connection management system of claim 13, further comprising cables connecting between the third set of connectors on the first PCB and the first sets of connectors on the one or more second PCBs.

15. A power and lighting system, comprising:
a plurality of at least semi-rigid printed circuit boards (PCBs) each of the PCBs having
a thin, elongate, rectangular shape,
a plurality of conductors defined on metallization layers of the PCBs, at least some of the plurality of conductors being adapted to transmit power,
a plurality of connectors mounted directly on one side of the PCBs along their lengths, the connectors being electrically connected to the conductors, and
attachment structure on a side opposite the plurality of connectors;
a plurality of cables adapted to connect between the connectors of respective ones of the plurality of PCBs;
at least one light-emitting diode (LED) light engine electrically connected to one of the plurality of PCBs; and
a power supply directly electrically connected to at least one, but fewer than all, of the PCBs via the plurality of connectors;
wherein the plurality of PCBs are adapted to attach directly to a substrate using the attachment structure to form an electrical distribution network to distribute power from the power supply to the at least one LED light engine.

16. The power and lighting system of claim 15, wherein the attachment structure comprises adhesives or magnets.

17. The power and lighting system of claim 15, wherein the power distribution network comprises a power distribution grid.

18. The power and lighting system of claim 15, wherein the electrical distribution network is provided on a hidden portion of the substrate and the at least one LED light engine is indirectly electrically connected to the one of the plurality of PCBs via a connector that bridges between the hidden portion of the substrate and an area in which the at least one LED light engine is installed.

19. The power and lighting system of claim 15, wherein the plurality of connectors comprise surface-mount connectors.

20. The power and lighting system of claim 15, wherein the electrical distribution network also provides control signals.

21. The power and lighting system of claim 15, wherein some of the plurality of connectors have different orientations than others of the plurality of connectors.

22. A lighted shelving unit, comprising:
an upright support structure;
one or more shelves connected to the upright support structure;
one or more LED light engines associated with at least one of the one or more shelves; and
an electrical distribution network supplying the one or more LED light engines with power, the electrical distribution network comprising
a plurality of at least semi-rigid printed circuit boards (PCBs), each of the PCBs having
a thin, elongate, rectangular shape,
a plurality of conductors defined on metallization layers of the PCBs, at least some of the plurality of conductors being adapted to transmit power,
a plurality of connectors mounted directly on one side of the PCBs along their lengths, the connectors being electrically connected to the conductors, and
attachment structure on a side opposite the plurality of connectors, such that each of the plurality of PCBs is directly attached to a hidden portion of the shelving unit,
a plurality of cables adapted to connect between the connectors of respective ones of the plurality of PCBs, and
a power supply directly electrically connected to at least one, but fewer than all, of the PCBs via the plurality of connectors.

23. The lighted shelving unit of claim 22, wherein the plurality of connectors comprise surface-mount connectors.

24. The lighted shelving unit of claim 22, wherein some of the plurality of connectors have different orientations than others of the plurality of connectors.

25. The lighted shelving unit of claim 22, wherein the one or more LED light engines comprise a plurality of LED light engines, each of the plurality of LED light engines being connected to the electrical distribution network.

26. The lighted shelving unit of claim 22, wherein the electrical distribution network also supplies control signals to the one or more LED light engines.

* * * * *